(12) United States Patent
Yang et al.

(10) Patent No.: US 11,387,111 B2
(45) Date of Patent: Jul. 12, 2022

(54) PROCESSING OF WORKPIECES WITH REACTIVE SPECIES GENERATED USING ALKYL HALIDE

(71) Applicants: Mattson Technology, Inc., Fremont, CA (US); Beijing E-Town Semiconductor Technology, Co., LTD, Beijing (CN)

(72) Inventors: Michael X. Yang, Palo Alto, CA (US); Hua Chung, Saratoga, CA (US); Xinliang Lu, Fremont, CA (US)

(73) Assignees: Mattson Technology, Inc., Fremont, CA (US); Beijing E-Town Semiconductor Technology, Co., LTD, Beijing (CN)

( * ) Notice: Subject to any disclaimer, the term of this patent is extended or adjusted under 35 U.S.C. 154(b) by 697 days.

(21) Appl. No.: 16/379,912

(22) Filed: Apr. 10, 2019

(65) Prior Publication Data
US 2019/0318937 A1  Oct. 17, 2019

Related U.S. Application Data

(60) Provisional application No. 62/658,117, filed on Apr. 16, 2018, provisional application No. 62/657,114, filed on Apr. 13, 2018.

(51) Int. Cl.
*H01L 21/67* (2006.01)
*H01L 21/311* (2006.01)
(Continued)

(52) U.S. Cl.
CPC .... *H01L 21/31122* (2013.01); *C23C 14/3471* (2013.01); *H01J 37/32357* (2013.01);
(Continued)

(58) Field of Classification Search
None
See application file for complete search history.

(56) References Cited

U.S. PATENT DOCUMENTS 5,811,022 A  9/1998  Savas et al.
6,028,015 A  2/2000  Wang
(Continued)

FOREIGN PATENT DOCUMENTS

KR   10-0777043       11/2007
WO   WO 2010/045153   4/2010
WO   WO 2017/147365   8/2017

OTHER PUBLICATIONS

PCT International Search Report and Written Opinion for corresponding PCT Application No. PCT/US2019/026722, dated Jul. 24, 2019, 10 pages.
(Continued)

*Primary Examiner* — Shamim Ahmed
(74) *Attorney, Agent, or Firm* — Dority & Manning, P.A.

(57) ABSTRACT

Methods for material removal of a film, such as a metal nitride film, from a workpiece are provided. One example implementation is directed to a method for processing a workpiece. The workpiece can include a film (e.g., a metal nitride film). The method can include generating one or more species (e.g., hydrogen radicals, excited inert gas molecules, etc.). The method can include mixing alkyl halide with the one or more species to generate one or more alkyl radicals. The method can include exposing the film to the one or more alkyl radicals.

18 Claims, 7 Drawing Sheets

(51) Int. Cl.
  *H01L 21/3213* (2006.01)
  *H01L 21/02* (2006.01)
  *H01L 21/3065* (2006.01)
  *H01J 37/32* (2006.01)
  *C23C 14/34* (2006.01)

(52) U.S. Cl.
  CPC .... *H01J 37/32422* (2013.01); *H01L 21/0234* (2013.01); *H01L 21/3065* (2013.01); *H01L 21/32136* (2013.01); *H01L 21/67069* (2013.01); *H01J 37/321* (2013.01); *H01J 37/3244* (2013.01)

(56) References Cited

U.S. PATENT DOCUMENTS

| | | | |
|---|---|---|---|
| 6,107,197 | A | 8/2000 | Suzuki |
| 6,531,404 | B1 | 3/2003 | Padmapani et al. |
| 6,677,251 | B1 | 1/2004 | Lu |
| 7,541,200 | B1 | 6/2009 | Schravendijk et al. |
| 7,604,708 | B2 | 10/2009 | Wood et al. |
| 7,807,579 | B2 | 10/2010 | Yang |
| 7,901,743 | B2 | 3/2011 | Lee et al. |
| 9,214,319 | B2 | 12/2015 | Nagorny et al. |
| 9,214,355 | B2 | 12/2015 | Engelmann et al. |
| 9,837,270 | B1 | 12/2017 | Varadarajan |
| 2003/0042465 | A1 | 3/2003 | Ko |
| 2003/0134051 | A1 | 7/2003 | Jung et al. |
| 2004/0154743 | A1 | 8/2004 | Savas |
| 2006/0081273 | A1 | 4/2006 | McDermott |
| 2006/0191555 | A1* | 8/2006 | Yoshida ............ B08B 7/0035 134/1.1 |
| 2007/0062645 | A1 | 3/2007 | Fukuchi |
| 2007/0072422 | A1 | 3/2007 | Yeh |
| 2007/0190266 | A1 | 8/2007 | Fu |
| 2008/0261405 | A1 | 10/2008 | Yang |
| 2009/0274610 | A1 | 11/2009 | Ghoanneviss et al. |
| 2011/0117751 | A1 | 5/2011 | Sonthalia |
| 2012/0115325 | A1* | 5/2012 | Park ............ H01L 21/28562 977/890 |
| 2012/0285481 | A1 | 11/2012 | Lee et al. |
| 2013/0034968 | A1 | 2/2013 | Zhang et al. |
| 2014/0154889 | A1* | 6/2014 | Wang ............ H01L 21/02049 438/720 |
| 2015/0126027 | A1 | 5/2015 | Matsumoto |
| 2015/0126039 | A1* | 5/2015 | Korolik ............ H01L 21/3065 438/719 |
| 2015/0303065 | A1 | 10/2015 | Buckalew |
| 2015/0371869 | A1* | 12/2015 | Surla ............ H01L 21/31127 558/461 |
| 2016/0079062 | A1 | 3/2016 | Zheng |
| 2016/0260616 | A1 | 9/2016 | Li et al. |
| 2016/0276134 | A1 | 9/2016 | Collins et al. |
| 2016/0293432 | A1 | 10/2016 | Sherpa et al. |
| 2017/0053810 | A1* | 2/2017 | Yang ............ C23F 4/00 |
| 2017/0365487 | A1* | 12/2017 | Shen ............ H01L 27/11582 |
| 2018/0076051 | A1* | 3/2018 | Shinoda ............ H01L 21/32136 |

OTHER PUBLICATIONS

International Preliminary Report on Patentability for Application No. PCT/US2019/026722, dated Oct. 22, 2020, 7 pages.

Bao et al., "Mechanistic Study of Plasma Damage and $CH_4$ Recovery of Low k Dielectric Surface," International Interconnect Technology Conference, IEEE 2007, pp. 147-149.

"HMDS," Retrieved from the internet May 17, 2018, https://www.microchemicals.com/products/adhesion_promotion/hmds.html—2 pages.

Sang et al., "Selective dry etching of TiN nanostructures over $SiO_2$ nanotrenches using a Cl2/Ar/N2 inductively coupled plasma," *Journal of Vacuum Science & Technology* B 34(2), Mar./Apr. 2016—5 pages.

* cited by examiner

PROCESSING OF WORKPIECES WITH REACTIVE SPECIES GENERATED USING ALKYL HALIDE

PRIORITY CLAIM

The present application claims the benefit of priority of U.S. Provisional Application Ser. No. 62/657,114, filed on Apr. 13, 2018, titled "Processing of Workpieces With Reactive Species Generated Using Alkyl Halide," which is incorporated herein by reference. The present application claims the benefit of priority of U.S. Provisional Application Ser. No. 62/658,117, filed on Apr. 16, 2018, titled "Processing of Workpieces With Reactive Species Generated Using Alkyl Halide," which is incorporated herein by reference.

FIELD

The present disclosure relates generally to processing a workpiece using reactive species generated using an alkyl halide.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates. Post-implantation photoresist, post-etch residue, and other mask and/or material removal have been accomplished using plasma dry strip processes. In plasma dry strip processes, neutral particles from a plasma generated in a remote plasma chamber pass through a separation grid into a processing chamber to treat a workpiece, such as a semiconductor wafer. In plasma etch processes, radicals, ions, and other species generated in a plasma directly exposed to the workpiece can be used to etch and/or remove a material on a workpiece.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The workpiece can include a film (e.g., a metal nitride film). The method can include generating one or more species (e.g., hydrogen radicals, excited inert gas molecules, etc.). The method can include mixing alkyl halide with the one or more species to generate one or more alkyl radicals. The method can include exposing the film to the one or more alkyl radicals.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to surface treatment and/or material removal from workpieces, such as semiconductor workpieces. Workpieces can include metal nitride films, such as titanium nitride (TiN) and/or tantalum nitride (TaN). For instance, metal nitride films can be used to form gates of transistors, transistor work function metals, contact electrodes, diffusion barrier layers, lithography hardmask materials, and other applications.

Semiconductor fabrication can involve one or more material removal process(es), such as treatment and/or removal of metal nitride films. With increasingly stringent requirements in critical dimension integrity, material removal processes need to be very selective in semiconductor fabrication. With critical dimensions getting smaller and films getting thinner, selective removal of films such as metal nitride films play a more important role in device performance.

According to example embodiments of the present disclosure, a process can expose one or more films on a workpiece (e.g., metal nitride films) to alkyl radicals (e.g., methyl ($CH_3$) radicals) and/or a halogen containing acid (e.g., hydrogen halide such as HX where X is F, Cl, Br, or I). In some embodiments, the alkyl radicals and halogen containing acid can be generated by mixing an alkyl halide with one or more species, such as hydrogen radicals and/or excited inert gas molecules. The workpiece can be exposed to resulting alkyl radicals and halogen containing acid for selective removal of a metal nitride film (e.g., TiN film and/or TaN film) from the workpiece.

Aspects of the present disclosure are discussed with reference to removal of metal nitride films. However, other types of films and/or materials can be removed and/or treated using the processes described herein without deviating from the scope of the present disclosure.

In some embodiments, the method can include generating one or more hydrogen radicals in a plasma chamber that is separated from the processing chamber by a separation grid. The hydrogen radicals can be generated, for instance, by inducing a plasma in a process gas using a plasma source (e.g., inductive plasma source, capacitive plasma source, etc.). The process gas can be, for instance, a mixture including $H_2$ and $N_2$ or can be a mixture including $H_2$ and He or can be a mixture including $H_2$ and Ar. In some other embodiments, the hydrogen radicals can be generated, for instance, using a heated filament, such as a heated tungsten filament.

In some embodiments, the method can include generating one or more excited inert gas molecules (e.g., excited He molecules) in a plasma chamber that is separated from the processing chamber by a separation grid. The excited inert gas molecules can be generated, for instance, by inducing a plasma in a process gas using a plasma source (e.g., inductive plasma source, capacitive plasma source, etc.). The process gas can be an inert gas. For instance, the process gas can be helium, argon, xenon, or other inert gas.

The method can include filtering ions while allowing the passage of neutral species to generate a filtered mixture with neutral radicals for exposure to the workpiece. For instance, a separation grid can be used to filter ions generated in the plasma chamber and allow passage of neutral species (e.g., neutral radicals) through holes in the separation grid to the processing chamber for exposure to the workpiece. The neutral radicals can include, for instance, alkyl radicals (e.g., $CH_3$ radicals).

In some embodiments, the alkyl radicals and/or hydrogen halide can be generated by mixing an alkyl halide with the hydrogen radicals generated in the process chamber. The alkyl halide can have a chemical formula of $C_nH_{2n+1}X$, where n is in the range of 1 to 5 and X is F, Cl, Br, or I.

The alkyl halide can be mixed with the hydrogen radicals in the plasma chamber and/or by injecting a gas into post plasma mixtures. For instance, a plasma (e.g., $H_2$ plasma or inert gas plasma such as He plasma) can be generated in a remote plasma chamber. The mixture can pass through a separation grid assembly for ion filtering. Post ion filtering and/or during ion filtering, an alkyl halide can be injected into the filtered mixture (e.g., at the separation grid) for generation of alkyl radicals (e.g., $CH_3$ radicals) and/or hydrogen halide.

The workpiece can be supported on a pedestal or workpiece support. The pedestal or workpiece support can include a temperature regulation system (e.g., one or more electrical heaters) used to control a temperature of the workpiece temperature during processing. In some embodiments, process can be carried out with the workpiece at a temperature in the range of about 20° C. to about 500° C.

In some embodiments, a plasma can be generated in a processing chamber containing the workpiece that is directly exposed to the workpiece. In some embodiments, the plasma can be generated using a bias source (e.g., bias electrode) associated with the pedestal supporting the workpiece in the processing chamber. The plasma in the processing chamber can be used to dissociate a mixture (e.g., alkyl radicals and/or hydrogen halide) into ions and other radicals, including alkyl radicals (e.g., $CH_3$ radicals), hydrogen ions, and halide ions in the processing chamber containing the workpiece.

The alkyl radicals, hydrogen ions, and halide ions can be exposed the metal nitride film for selective removal of the metal nitride film. For example, the halide ions can react with the metal nitride to produce a metal halide (e.g., TiX and/or TaX where X is F, Cl, Br, or I). The hydrogen ions and alkyl radicals (e.g., $CH_3$ radicals) can react with the metal nitride to produce an amine. The amine can include at least one of $HN(CH_3)_2$ or $H_2N(CH_3)$. The metal halide and the amine can be evacuated from the processing chamber using, for instance, a gas evacuation port. In this way, the ions and radicals generated in the processing chamber can etch the metal nitride film on the workpiece.

In some example embodiments, the process can be implemented in a plasma processing apparatus having a plasma chamber separated from a processing chamber by a separation grid. A first plasma (e.g., a remote plasma) can be generated in the plasma chamber to generate one or more hydrogen radicals from a process gas (e.g., a mixture including $H_2$ and $N_2$, a mixture including $H_2$ and He, or a mixture including $H_2$ and Ar, or an inert gas). Ions generated in the plasma can be filtered using the separation grid. An alkyl halide can be injected into the hydrogen radicals at the separation grid or immediately following the separation grid to generate one or more alkyl radicals (e.g., $CH_3$) and hydrogen halide (e.g., HX where X is F, Cl, Br, or I).

A second plasma (e.g., a direct plasma) can be generated in the processing chamber using, for instance, a bias source located in a pedestal supporting the workpiece in the processing chamber. The direct plasma can dissociate the mixture of alkyl radicals and the hydrogen halide into, for instance, a mixture including alkyl radicals, hydrogen ions, and halide ions. The alkyl radicals, hydrogen ions, and halide ions can react with a metal nitride film on the workpiece to etch and/or remove the metal nitride film.

For instance, the halide ions can react with the metal nitride to produce a metal halide (e.g., TiX and/or TaX where X is F, Cl, Br, or I). The hydrogen ions and alkyl radicals (e.g., $CH_3$ radicals) can react with the metal nitride to produce an amine. The amine can include at least one of $HN(CH_3)_2$ or $H_2N(CH_3)$. The metal halide and the amine can be evacuated from the processing chamber using, for instance, a gas evacuation port.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece.

Figure 1:
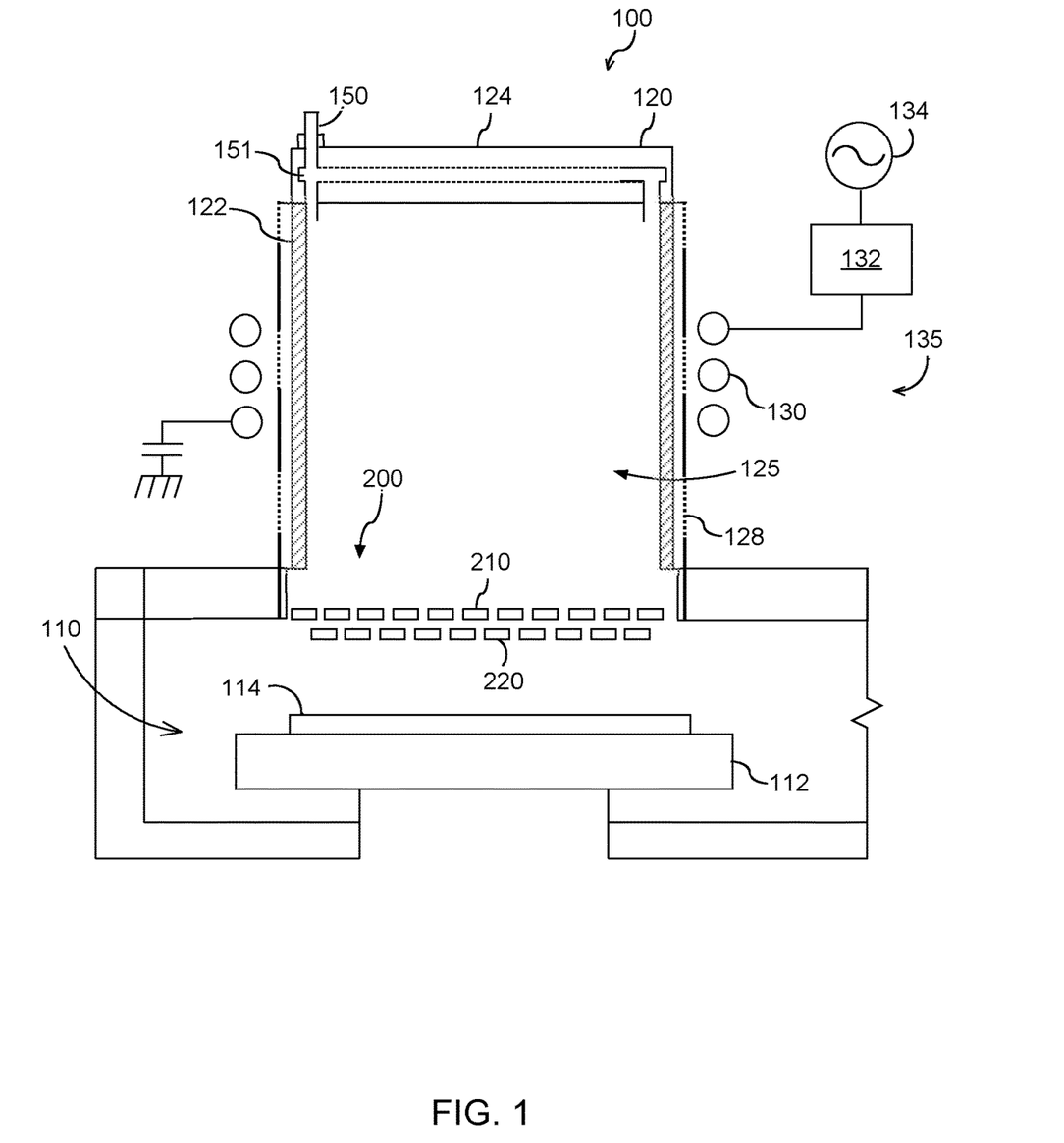
FIG. 1 depicts an example plasma processing apparatus according to example embodiments of the present disclosure.

FIG. 1 depicts an example plasma processing apparatus 100 that can be used to perform processes according to example embodiments of the present disclosure. As illustrated, plasma processing apparatus 100 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., reactant and carrier gases) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

Figure 2:
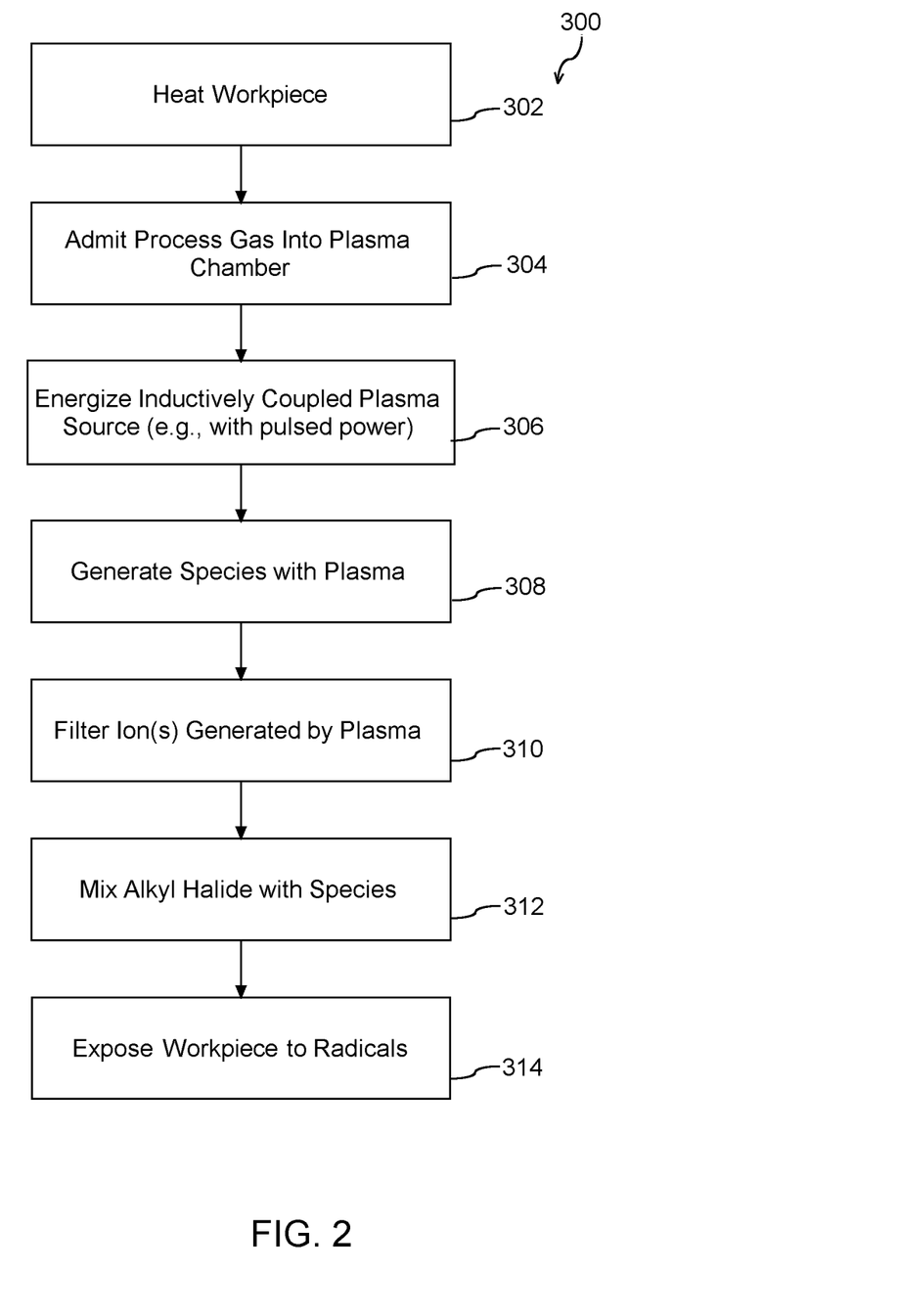
FIG. 2 depicts a flow diagram of an example method according to example embodiments of the present disclosure.

FIG. 2 depicts a flow diagram of an example method (300) according to example aspects of the present disclosure. The method (300) can be implemented using the plasma processing apparatus 100. However, as will be discussed in detail below, the methods according to example aspects of the present disclosure can be implemented using other approaches without deviating from the scope of the present disclosure. FIG. 2 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (302), the method can include heating the workpiece. For instance, the workpiece 114 can be heated in the processing chamber to a process temperature. The workpiece 114 can be heated, for instance, using one or more heating systems associated with the pedestal 112. In some embodiments, the workpiece can be heated to a process temperature in the range of about 20° C. to about 400° C.

At (304), the method can include admitting a process gas mixture into the plasma chamber. For instance, a process gas can be admitted into the plasma chamber interior 125 from a gas source 150 via annular gas distribution channel 151 or other suitable gas introduction mechanism. The process gas can include a reactive gas, such as hydrogen gas ($H_2$). The process gas can include a carrier gas such as $N_2$ and/or He and/or Ar. For example, in some embodiments, the process gas can be a mixture including $H_2$ and $N_2$. In some other embodiments, the process gas can be a mixture including $H_2$ and He. In yet some other embodiments, the process gas can be a mixture including $H_2$ and Ar.

In some embodiments, the process gas is an inert gas. The process gas can be an inert gas with no reactive gas. The process gas can be, for instance, helium, argon, xenon, or other inert gas.

At (306), the method can include energizing an inductively coupled plasma source to generate a plasma in a plasma chamber. For instance, induction coil 130 can be energized with RF energy from RF power generator 134 to generate a plasma in the plasma chamber interior 125. In some embodiments, the inductively coupled power source can be energized with pulsed power to obtain desired radicals with reduced plasma energy. At (308), the plasma can be used to generate one or more species from the process gas.

At (310), the method can include filtering one or more ions generated by the plasma in the mixture to create a filtered mixture. The filtered mixture can include species (e.g., H radicals, excited inert gas molecules, etc.) generated by the plasma in the process gas.

In some embodiments, the one or more ions can be filtered using a separation grid assembly separating the plasma chamber from a processing chamber where the workpiece is located. For instance, separation grid 200 can be used to filter ions generated by the plasma.

The separation grid 200 can have a plurality of holes. Charged particles (e.g., ions) can recombine on the walls in their path through the plurality of holes. Neutral particles (e.g., radicals) can pass through the holes. In some embodiments, the separation grid 200 can be configured to filter ions with an efficiency greater than or equal to about 90%, such as greater than or equal to about 95%.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (312), the method can include mixing an alkyl halide with the species to generate one or more alkyl radicals (e.g., methyl radicals ($CH_3$) radicals) and/or one or more hydrogen halide (e.g., HX where X is F, Cl, Br, or I). The alkyl halide can have a chemical formula of $C_nH_{2n+1}X$, where n is in the range of 1 to 5 and X is F, Cl, Br, or I.

Figure 3:
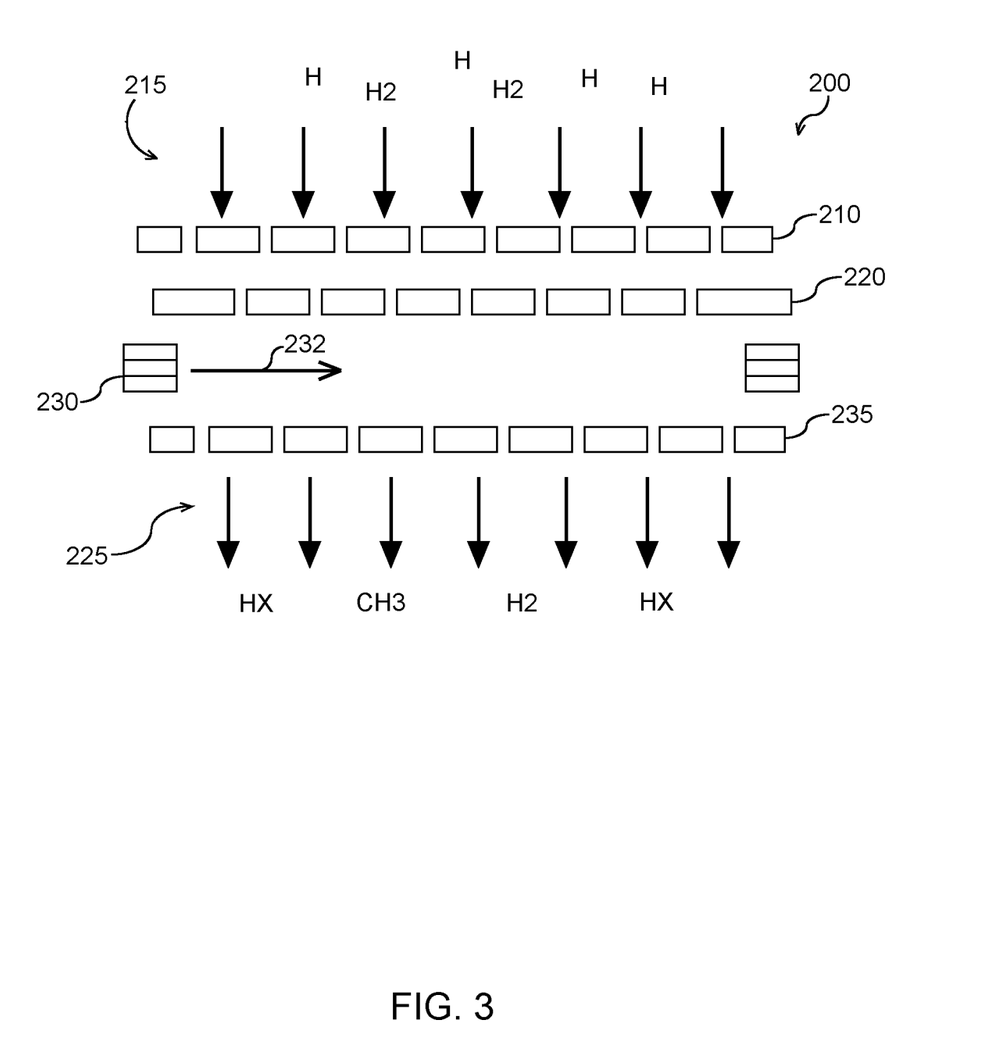
FIG. 3 depicts example mixing of an alkyl halide with one or more hydrogen radicals according to example embodiments of the present disclosure.

The alkyl halide can be mixed with the species in the plasma chamber and/or by injecting a gas into post plasma mixtures. FIG. 3 depicts an example separation grid 200 for injection of alkyl halides post plasma according to example embodiments of the present disclosure. More particularly, the separation grid 200 includes a first grid plate 210 and a second grid plate 220 disposed in parallel relationship for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Neutral and charged particles 215 from the plasma can be exposed to the separation grid 200. Charged particles (e.g., ions) can recombine on the walls in their path through the holes of each grid plate 210, 220 in the separation grid 200. Neutral species (e.g., H radicals and/or excited inert gas molecules) can flow relatively freely through the holes in the first grid plate 210 and the second grid plate 220.

Subsequent to the second grid plate 220, a gas injection source 230 can be configured to mix an alkyl halide 232 into the hydrogen radicals. A mixture 225 including alkyl radicals (e.g., $CH_3$) radicals and hydrogen halide (HX where X is F, Cl, Br, or I) resulting from the injection of alkyl halide can pass through a third grid plate 235 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the alkyl halide can be mixed with the hydrogen radicals at any point in the separation grid and/or after the separation grid in the processing chamber.

At (314) of FIG. 2, the method can include exposing the workpiece to the filtered mixture. More particularly, the workpiece can be exposed to alkyl radicals (e.g., $CH_3$ radicals) and hydrogen halide. In some embodiments, exposing the workpiece to the alkyl radicals and hydrogen halide can result in at least partial removal of a metal nitride film on the workpiece, such as a TiN film and/or a TaN film.

Figure 4:
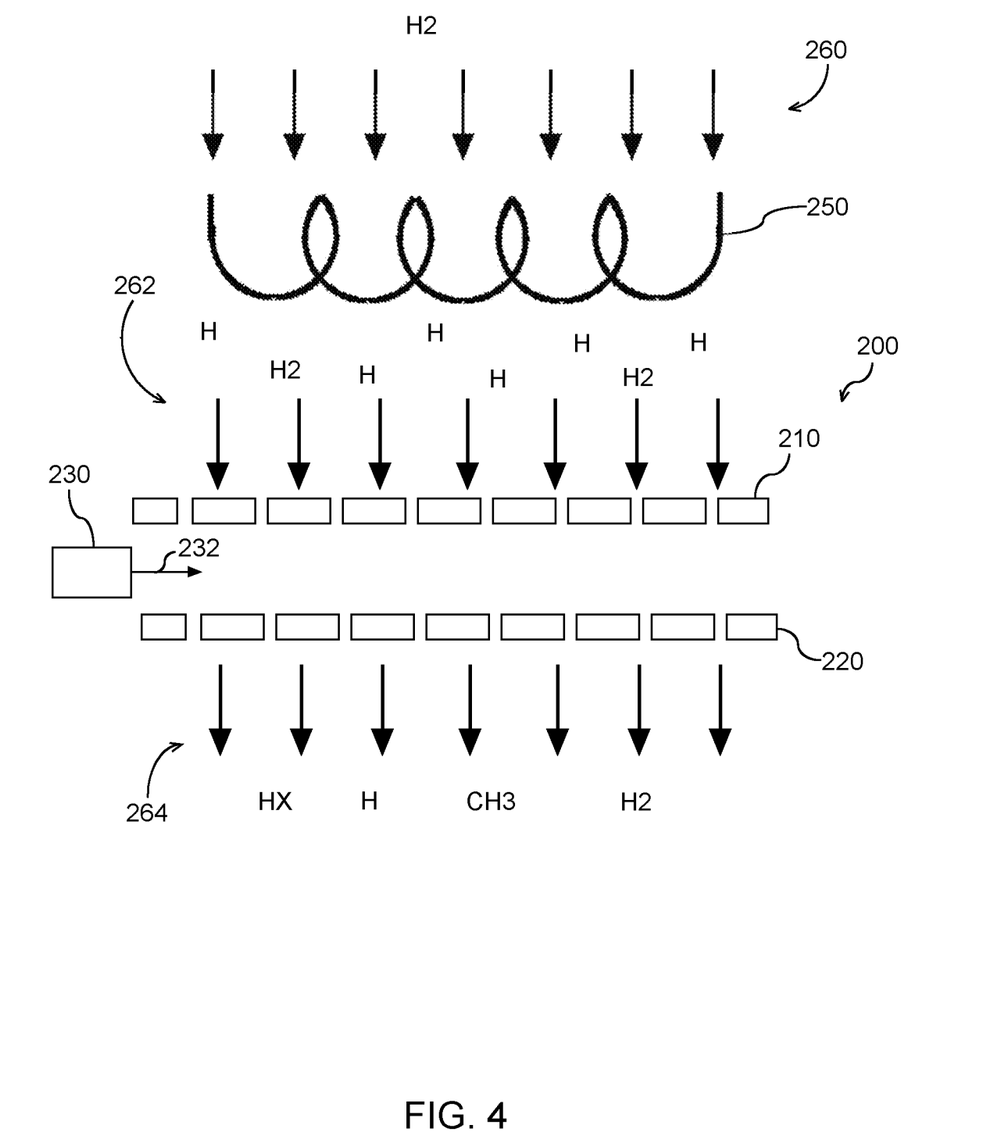
FIG. 4 depicts example mixing of an alkyl halide with one or more hydrogen radicals according to example embodiments of the present disclosure.

In some embodiments, the species can include hydrogen radicals can be generated using a different source of hydrogen radicals. For instance, as shown in FIG. 4, a hydrogen gas $H_2$ can be passed over a heated filament (e.g., a tungsten filament) to generate hydrogen radicals in a first chamber. The filament can be heated to a temperature in the range of about 1200° C. to about 2200° C. The hydrogen radicals can be passed through a separation grid 200.

The separation grid 200 includes a first grid plate 210 and a second grid plate 220 disposed in parallel relationship. The first grid plate 210 can have a first grid pattern having a plurality of holes. The second grid plate 220 can have a second grid pattern having a plurality of holes. The first grid pattern can be the same as or different from the second grid pattern.

Subsequent to the first grid plate 210, a gas injection source 230 can be configured to admit alkyl halide into the hydrogen radicals. A mixture 264 including alkyl radicals and hydrogen halide resulting from the injection of alkyl halide can pass through a second grid plate 220 for exposure to the workpiece. A gas injection source 230 can be configured to mix an alkyl halide 232 into the hydrogen radicals.

A mixture 225 including alkyl radicals (e.g., $CH_3$) radicals and hydrogen halide (HX where X is F, Cl, Br, or I) resulting from the injection of alkyl halide into the hydrogen radicals can pass through the separation grid for exposure to the workpiece in the processing chamber.

In some embodiments, the alkyl radicals and hydrogen halide can be further processed to generate alkyl radicals, hydrogen ions, and halide ions for selective removal of a metal nitride on the workpiece. For instance, a mixture including alkyl radicals, hydrogen ions, and halide ions can be generated using a plasma induced in the processing chamber containing the workpiece. The plasma can be a direct plasma with direct exposure to the workpiece. The plasma can be generated, in some embodiments, using a bias source located in a workpiece support in the processing chamber. Other methods of generating a plasma can be used without deviating from the scope of the present disclosure.

Figure 5:
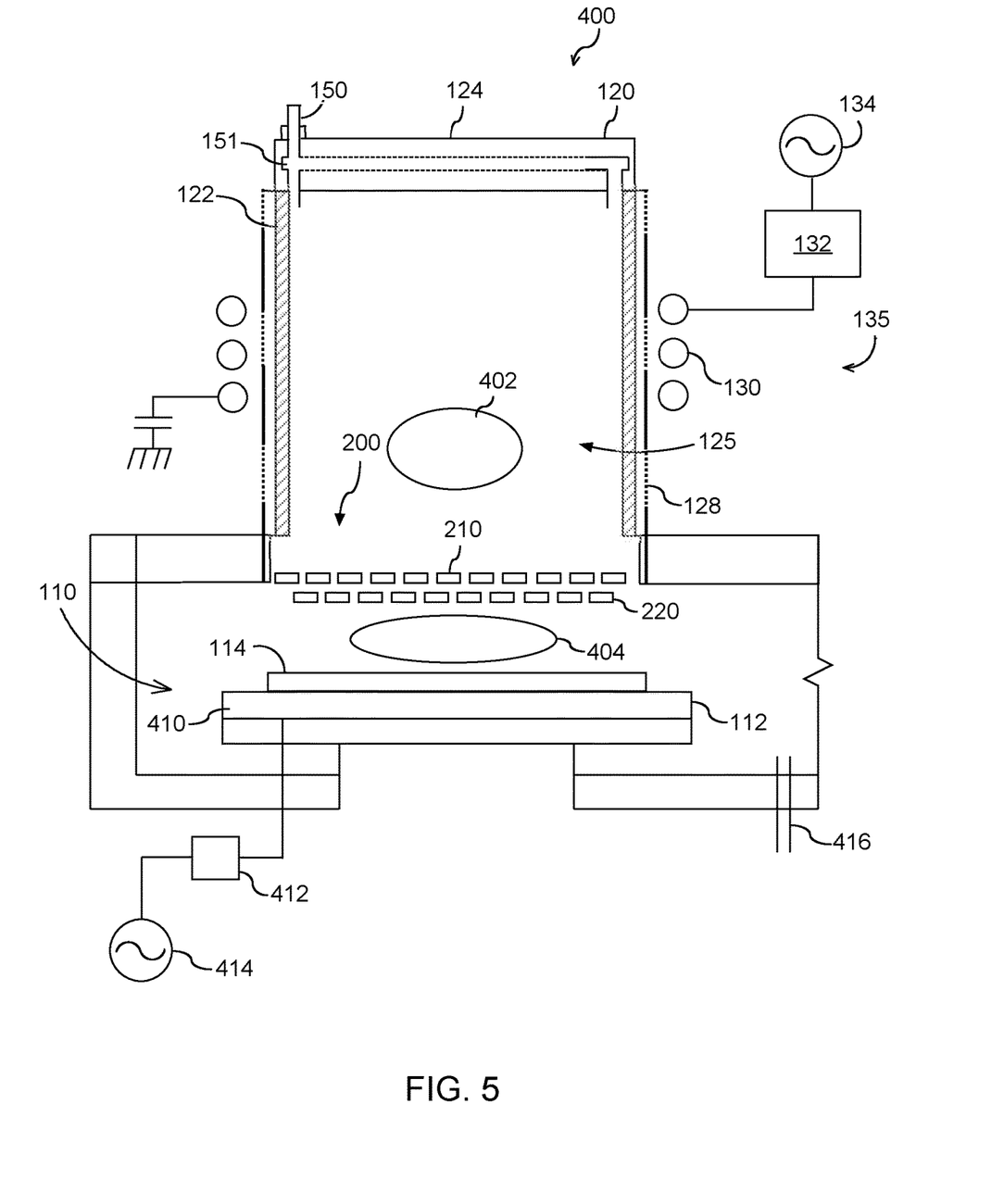
FIG. 5 depicts an example plasma processing apparatus according to example embodiments of the present disclosure.

FIG. 5 depicts an example plasma processing apparatus 400 that can be used to implement processes according to example embodiments of the present disclosure. The plasma processing apparatus 400 is similar to the plasma processing apparatus 100 of FIG. 1.

More particularly, plasma processing apparatus 400 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., reactant and carrier gases) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 5, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 400 of FIG. 5 is operable to generate a first plasma 402 (e.g., a remote plasma) in the plasma chamber 120 and a second plasma 404 (e.g., a direct plasma) in the processing chamber 110. As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 400 of FIG. 5 includes a bias source having bias electrode 410 in the pedestal 112. The bias electrode 410 can be coupled to an RF power generator 414 via a suitable matching network 412. When the bias electrode 410 is energized with RF energy, a second plasma 404 can be generated from a mixture in the processing chamber 110 for direct exposure to the workpiece 114.

As an example, the induction coil 130 can be energized with RF energy to generate a plasma 402 in the plasma chamber 120 from a process gas. For example, in some embodiments, the process gas can be a mixture including $H_2$ and $N_2$. In some other embodiments, the process gas can be a mixture including $H_2$ and He. In yet some other embodiments, the process gas can be a mixture including $H_2$ and Ar.

In some embodiments, the process gas is an inert gas. The process gas can be an inert gas with no reactive gas. The process gas can be, for instance, helium, argon, xenon, or other inert gas.

The plasma 402 can generate species (e.g., hydrogen radicals) which can pass through separation grid assembly 200. An alkyl halide gas can be mixed with the species at the separation grid assembly 200, in the plasma chamber 120, and/or in the processing chamber 110 to generate a mixture of alkyl radicals (e.g., $CH_3$ radicals) and hydrogen halide (HX where X is F, Cl, Br, or I).

The bias electrode 410 can be energized with RF energy to generate a second plasma 404 from the mixture of alkyl radicals and hydrogen halide. The workpiece 414 can be directly exposed to the second plasma 404. The second plasma 404 can generate a mixture of alkyl radicals e.g., $CH_3$ radicals), hydrogen ions, and halide ions (e.g., Cl ions, F ions, Br ions, I ions) from the mixture of alkyl radicals and hydrogen halide.

The mixture of alkyl radicals, hydrogen ions, and halide ions can be exposed to a metal nitride film (e.g., TiN film and/or TaN) film to etch and/or remove at least a portion of the metal nitride film. For instance, the halide ions can react with the metal nitride to produce a metal halide (e.g., TiX and/or TaX where X is F, Cl, Br, or I). The hydrogen ions and alkyl radicals (e.g., $CH_3$ radicals) can react with the metal nitride to produce an amine. The amine can include at least one of $HN(CH_3)_2$ or $H_2N(CH_3)$. The metal halide and the amine can be evacuated from the processing chamber 110 using, for instance, a gas evacuation port 416.

The second plasma can be generated in the processing chamber 110 in other manners without deviating from the scope of the present disclosure. For instance, FIG. 6 depicts a processing chamber 500 similar to that of FIG. 1 and FIG. 5.

More particularly, plasma processing apparatus 500 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., reactant and carrier gases) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

Figure 6:
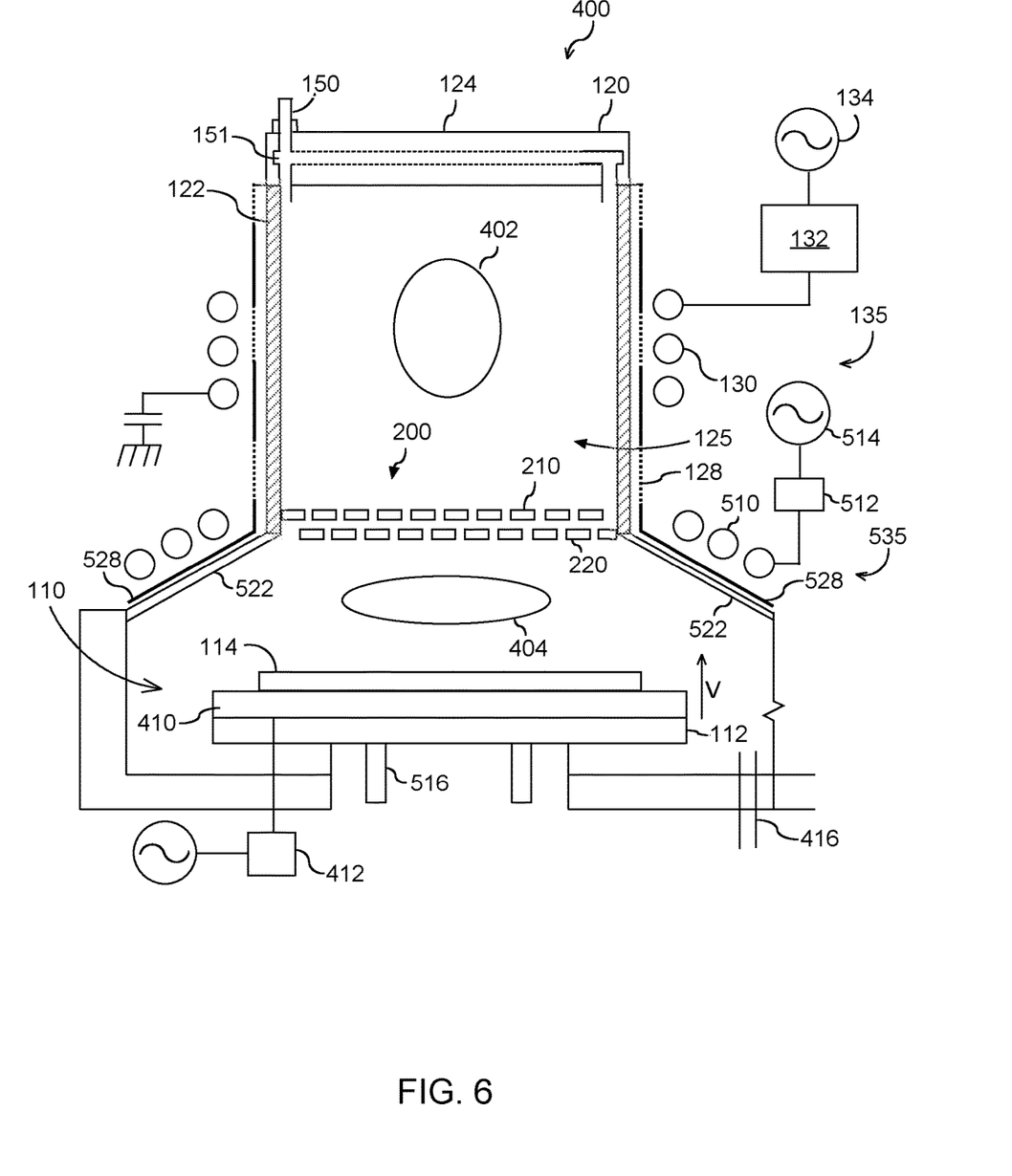
FIG. 6 depicts an example plasma processing apparatus according to example embodiments of the present disclosure.

As shown in FIG. 6, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 500 of FIG. 6 is operable to generate a first plasma 402 (e.g., a remote plasma) in the plasma chamber 120 and a second plasma 404 (e.g., a direct plasma) in the processing chamber 110. As shown, the plasma processing apparatus 500 can include an angled dielectric sidewall 522 that extends from the vertical sidewall 122 associated with the remote plasma chamber 120. The angled dielectric sidewall 522 can form a part of the processing chamber 110.

A second inductive plasma source 535 can be located proximate the dielectric sidewall 522. The second inductive plasma source 535 can include an induction coil 510 coupled to an RF generator 514 via a suitable matching network 512. The induction coil 510, when energized with RF energy, can induce a direct plasma 404 from a mixture in the processing chamber 110. A Faraday shield 528 can be disposed between the induction coil 510 and the sidewall 522

The pedestal 114 can be movable in a vertical direction V. For instance, the pedestal 114 can include a vertical lift 516 that can be configured to adjust a distance between the pedestal 114 and the separation grid assembly 200. As one example, the pedestal 114 can be located in a first vertical position for processing using the remote plasma 402. The pedestal 114 can be in a second vertical position for processing using the direct plasma 404. The first vertical position can be closer to the separation grid assembly 200 relative to the second vertical position.

The plasma processing apparatus 500 of FIG. 6 includes a bias source having bias electrode 410 in the pedestal 112. The bias electrode 410 can be coupled to an RF power generator 414 via a suitable matching network 412.

As an example, the induction coil 130 can be energized with RF energy to generate a plasma 402 in the plasma chamber 120 from a process gas. For example, in some embodiments, the process gas can be a mixture including $H_2$ and $N_2$. In some other embodiments, the process gas can be a mixture including $H_2$ and He. In yet some other embodiments, the process gas can be a mixture including $H_2$ and Ar.

In some embodiments, the process gas is an inert gas. The process gas can be an inert gas with no reactive gas. The process gas can be, for instance, helium, argon, xenon, or other inert gas.

The plasma 402 can generate species (e.g., hydrogen radicals) which can pass through separation grid assembly 200. An alkyl halide gas can be mixed with the hydrogen radicals at the separation grid assembly 200, in the plasma chamber 120, and/or in the processing chamber 110 to generate a mixture of alkyl radicals (e.g., $CH_3$ radicals) and hydrogen halide (HX where X is F, Cl, Br, or I).

The plasma source 535 can be energized with RF energy to generate a second plasma 404 from the mixture of alkyl radicals and hydrogen halide. The workpiece 414 can be directly exposed to the second plasma 404. The second plasma 404 can generate a mixture of alkyl radicals e.g., $CH_3$ radicals), hydrogen ions, and halide ions (e.g., Cl ions, F ions, Br ions, I ions) from the mixture of alkyl radicals and hydrogen halide.

The mixture of alkyl radicals, hydrogen ions, and halide ions can be exposed to a metal nitride film (e.g., TiN film and/or TaN) film to etch and/or remove at least a portion of the metal nitride film. For instance, the halide ions can react with the metal nitride to produce a metal halide (e.g., TiX and/or TaX where X is F, Cl, Br, or I). The hydrogen ions and alkyl radicals (e.g., $CH_3$ radicals) can react with the metal nitride to produce an amine. The amine can include at least one of $HN(CH_3)_2$ or $H_2N(CH_3)$. The metal halide and the amine can be evacuated from the processing chamber 110 using, for instance, a gas evacuation port 416.

Figure 7:
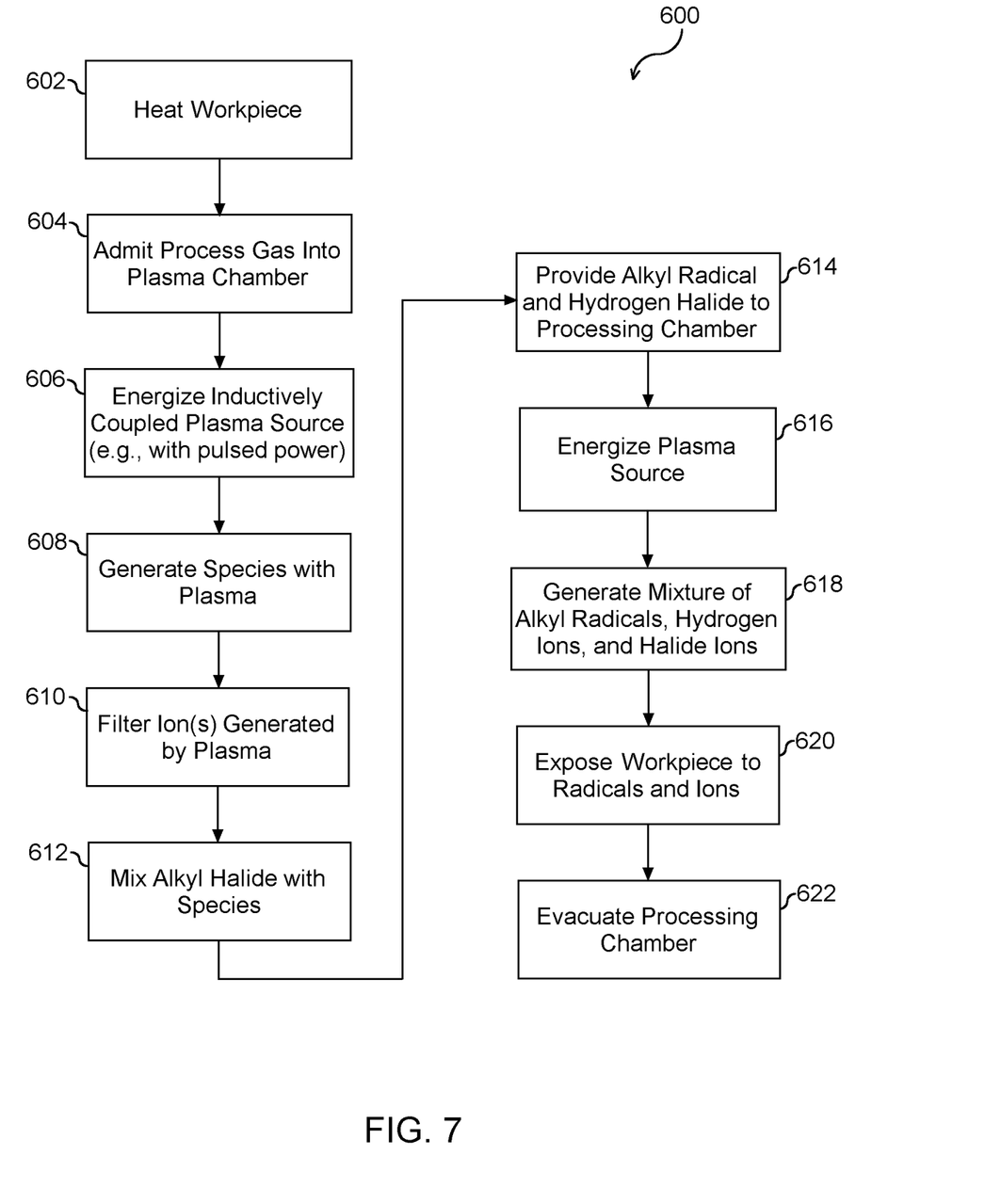
FIG. 7 depicts a flow diagram of an example method according to example embodiments of the present disclosure.

FIG. 7 depicts a flow diagram of an example method (600) according to example aspects of the present disclosure. The method (600) can be implemented using any suitable plasma processing apparatus, such as the plasma processing apparatus 400 of FIG. 5 or the plasma processing apparatus 500 of FIG. 6. FIG. 7 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (602), the method can include heating the workpiece. For instance, the workpiece 114 can be heated in the processing chamber to a process temperature. The workpiece 114 can be heated, for instance, using one or more heating systems associated with the pedestal 112. In some embodiments, the workpiece can be heated to a process temperature in the range of about 20° C. to about 400° C.

At (604), the method can include admitting a process gas mixture into the plasma chamber. For instance, a process gas can be admitted into the plasma chamber interior 125 from a gas source 150 via annular gas distribution channel 151 or other suitable gas introduction mechanism. The process gas can include a reactive gas, such as hydrogen gas ($H_2$). The process gas can include a carrier gas such as $N_2$ and/or He and/or Ar. For example, in some embodiments, the process gas can be a mixture including $H_2$ and $N_2$. In some other embodiments, the process gas can be a mixture including $H_2$ and He. In yet some other embodiments, the process gas can be a mixture including $H_2$ and Ar.

In some embodiments, the process gas is an inert gas. The process gas can be an inert gas with no reactive gas. The process gas can be, for instance, helium, argon, xenon, or other inert gas.

At (606), the method can include energizing an inductively coupled plasma source to generate a plasma in a plasma chamber. For instance, induction coil 130 can be energized with RF energy from RF power generator 134 to generate a plasma in the plasma chamber interior 125. In some embodiments, the inductively coupled power source can be energized with pulsed power to obtain desired radicals with reduced plasma energy. At (608), the plasma can be used to generate one or more species (e.g., hydrogen radicals, excited inert gas molecules) from the process gas.

At (610), the method can include filtering one or more ions generated by the plasma in the mixture to create a filtered mixture. The filtered mixture can include species (e.g., hydrogen radicals, excited inert gas molecules) generated by the plasma in the process gas.

In some embodiments, the one or more ions can be filtered using a separation grid assembly separating the plasma chamber from a processing chamber where the workpiece is located. For instance, separation grid 200 can be used to filter ions generated by the plasma.

The separation grid 200 can have a plurality of holes. Charged particles (e.g., ions) can recombine on the walls in their path through the plurality of holes. Neutral particles (e.g., radicals) can pass through the holes. In some embodiments, the separation grid 200 can be configured to filter ions with an efficiency greater than or equal to about 90%, such as greater than or equal to about 95%.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (612), the method can include mixing an alkyl halide with the species to generate one or more alkyl radicals (e.g., methyl radicals ($CH_3$) radicals) and/or one or more hydrogen halide (e.g., HX where X is F, Cl, Br, or I). The alkyl halide can have a chemical formula of $C_nH_{2n+1}X$, where n is in the range of 1 to 5 and X is F, Cl, Br, or I. The alkyl halide can be mixed with the hydrogen radicals in the plasma chamber and/or by injecting a gas into post plasma mixtures. Mixing the alkyl halide with the hydrogen radicals can generate a mixture including alkyl radicals (e.g., $CH_3$) radicals and hydrogen halide (HX where X is F, Cl, Br, or I).

At (614), the method can include providing the alkyl radicals and hydrogen halide to the processing chamber. For instance, the alkyl radicals and hydrogen halide can be provided to the processing chamber 110.

At (616), the method can include energizing a plasma source to induce a plasma (e.g., a direct plasma) in the processing chamber. For instance, a bias source 410 and/or an induction coil 510 can be energized with RF energy to induce a direct plasma 404 in the processing chamber 110. The direct plasma can be used to generate a mixture of alkyl radicals, hydrogen ions, and halide ions from the alkyl radicals and hydrogen halide (618).

At (620), the method can include exposing the workpiece to the mixture including alkyl radicals (e.g., $CH_3$ radicals), hydrogen ions, and halide ions. In some embodiments, exposing the workpiece to the alkyl radicals, hydrogen ions, and halide ions can result in at least partial removal of a metal nitride film on the workpiece, such as a TiN film and/or a TaN film.

For instance, the halide ions can react with the metal nitride to produce a metal halide (e.g., TiX and/or TaX where X is F, Cl, Br, or I). The hydrogen ions and alkyl radicals (e.g., $CH_3$ radicals) can react with the metal nitride to produce an amine. The amine can include at least one of $HN(CH_3)_2$ or $H_2N(CH_3)$.

At (622), the metal halide and the amine can be evacuated from the processing chamber. For instance, the metal halide and the amine can be evacuated from the processing chamber 110 via gas port 416.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising a film, the workpiece disposed in a processing chamber separated from a plasma chamber by a separation grid, the separation grid comprising a first grid plate and a second grid plate, the method comprising:
   generating one or more species in the plasma chamber by inducing a plasma in a process gas using a plasma source;
   mixing alkyl halide with the one or more species using an injection port disposed between the first grid plate and the second grid plate to generate one or more alkyl radicals; and
   exposing the film to the one or more alkyl radicals.

2. The method of claim 1, wherein the one or more alkyl halides have a chemical formula of $C_nH_{2n+1}X$, where n is in the range of 1 to 5 and X is F, Cl, Br, or I.

3. The method of claim 2, wherein the alkyl radical comprises a $CH_3$ radical.

4. The method of claim 1, wherein the film comprises a metal and nitrogen containing film.

5. The method of claim 1, wherein the film comprises titanium nitride.

6. The method of claim 1, wherein the film comprises tantalum nitride.

7. The method of claim 1, wherein mixing alkyl halide with the one or more species comprises generating one or more alkyl radicals and a hydrogen halide.

8. The method of claim 7, where the hydrogen halide comprises HF, HCl, HBr or HI.

9. The method of claim 1, wherein the process gas comprises hydrogen and the species comprise hydrogen radicals.

10. The method of claim 1, wherein the process gas is an inert gas.

11. The method of claim 10, wherein the inert gas is helium.

12. The method of claim 1, wherein the one or more species comprise hydrogen radicals generated using a heated filament.

13. The method of claim 1, wherein the method further comprises generating a mixture comprising alkyl radicals, hydrogen ions, and halide ions in a processing chamber containing the workpiece.

14. The method of claim 13, wherein the method comprises exposing the alkyl radicals, hydrogen ions, and halide ions to the film.

15. The method of claim 14, wherein the mixture comprising alkyl radicals, hydrogen ions, and halide ions is generated from the alkyl radicals and hydrogen halide using a plasma generated in the processing chamber containing the workpiece.

16. The method of claim 15, wherein the plasma is generated using a bias source in a pedestal operable to support the workpiece in the processing chamber.

17. A method for processing a workpiece containing a metal and nitrogen containing film, the workpiece disposed in a processing chamber separated from a plasma chamber via a separation grid, the separation grid comprising a first grid plate and a second grid plate, the method comprising:
   generating one or more species in a mixture in the plasma chamber;
   filtering one or more ions in the plasma chamber to generate a filtered mixture;
   injecting one or more alkyl halides in the filtered mixture using an injection port disposed between the first grid plate and second grid plate to generate one or more alkyl radicals;
   exposing the metal and nitrogen containing film to the one or more alkyl radicals in the processing chamber.

18. The method of claim 17, further comprising:
generating a mixture comprising alkyl radicals, hydrogen ions, and halide ions using a plasma generated in the processing chamber using a bias source in a pedestal operable to support the workpiece in the processing chamber; and
exposing the metal and nitrogen containing film to the one or more alkyl radicals, hydrogen ions, and halide ions to remove at least a portion of the metal and nitrogen containing film.

* * * * *